(12) United States Patent
Kasai

(10) Patent No.: US 6,465,363 B1
(45) Date of Patent: Oct. 15, 2002

(54) VACUUM PROCESSING METHOD AND VACUUM PROCESSING APPARATUS

(75) Inventor: Masaru Kasai, Zama (JP)

(73) Assignee: Shibaura Mechatronics Corporation, Yokohama (JP)

( * ) Notice: Subject to any disclaimer, the term of this patent is extended or adjusted under 35 U.S.C. 154(b) by 0 days.

(21) Appl. No.: 09/429,558

(22) Filed: Oct. 28, 1999

Related U.S. Application Data

(63) Continuation of application No. PCT/JP98/01949, filed on Apr. 28, 1998.

(30) Foreign Application Priority Data

Apr. 28, 1997 (JP) .............................................. 9-111319

(51) Int. Cl.[7] .......................................... H01L 21/302
(52) U.S. Cl. ..................... 438/716; 438/727; 438/731; 216/62; 216/67
(58) Field of Search .............................. 216/58, 62, 67; 438/706, 710, 716, 725, 727, 731; 134/1, 1.1, 1.2, 1.3; 156/345

(56) References Cited

U.S. PATENT DOCUMENTS

| | | | |
|---|---|---|---|
| 4,180,432 A | | 12/1979 | Clark |
| 4,673,456 A | * | 6/1987 | Spenser et al. ............. 156/345 |
| 4,996,077 A | | 2/1991 | Moslehi et al. |
| 5,198,634 A | * | 3/1993 | Mattson et al. .............. 134/1.1 |
| 5,310,453 A | * | 5/1994 | Fukasawa et al. .......... 156/643 |
| 5,681,424 A | * | 10/1997 | Saito et al. .............. 156/643.1 |
| 6,174,366 B1 | * | 1/2001 | Ihantola ........................ 117/84 |

FOREIGN PATENT DOCUMENTS

| | | |
|---|---|---|
| JP | 55-82782 | 6/1980 |
| JP | 57-79620 | 5/1982 |
| JP | 59-150427 | 8/1984 |
| JP | 59-173273 | 10/1984 |
| JP | 8-64581 | 3/1986 |
| JP | 05114592 | 5/1993 |
| JP | 5-226653 | 9/1993 |
| JP | 5-275326 | 10/1993 |
| JP | 5-347282 | 12/1993 |
| JP | 7-106300 | 4/1995 |
| JP | 9-82787 | 3/1997 |
| JP | 9-246242 | 9/1997 |

* cited by examiner

*Primary Examiner*—Randy Gulakowski
*Assistant Examiner*—J. Smetana
(74) *Attorney, Agent, or Firm*—Oblon, Spivak, McClelland, Maier & Neustadt, P.C.

(57) ABSTRACT

A vacuum processing apparatus produces fluorine radicals by activating a fluorinating gas containing at least fluorine atoms and fluorinates the surface of a component formed of an organic material (32) exposed to an atmosphere of a processing chamber (2) before carrying an object (S) into the processing chamber (2). The object (S) is carried into the processing chamber (2) after the completion of a fluorinating process. The object (S) is processed with a processing gas containing at least oxygen radicals. Etching of the component formed of the organic material (32) can be prevented by the fluorination of surface of the component formed of the organic material (32) and exposed to an atmosphere in the processing chamber (2).

12 Claims, 5 Drawing Sheets

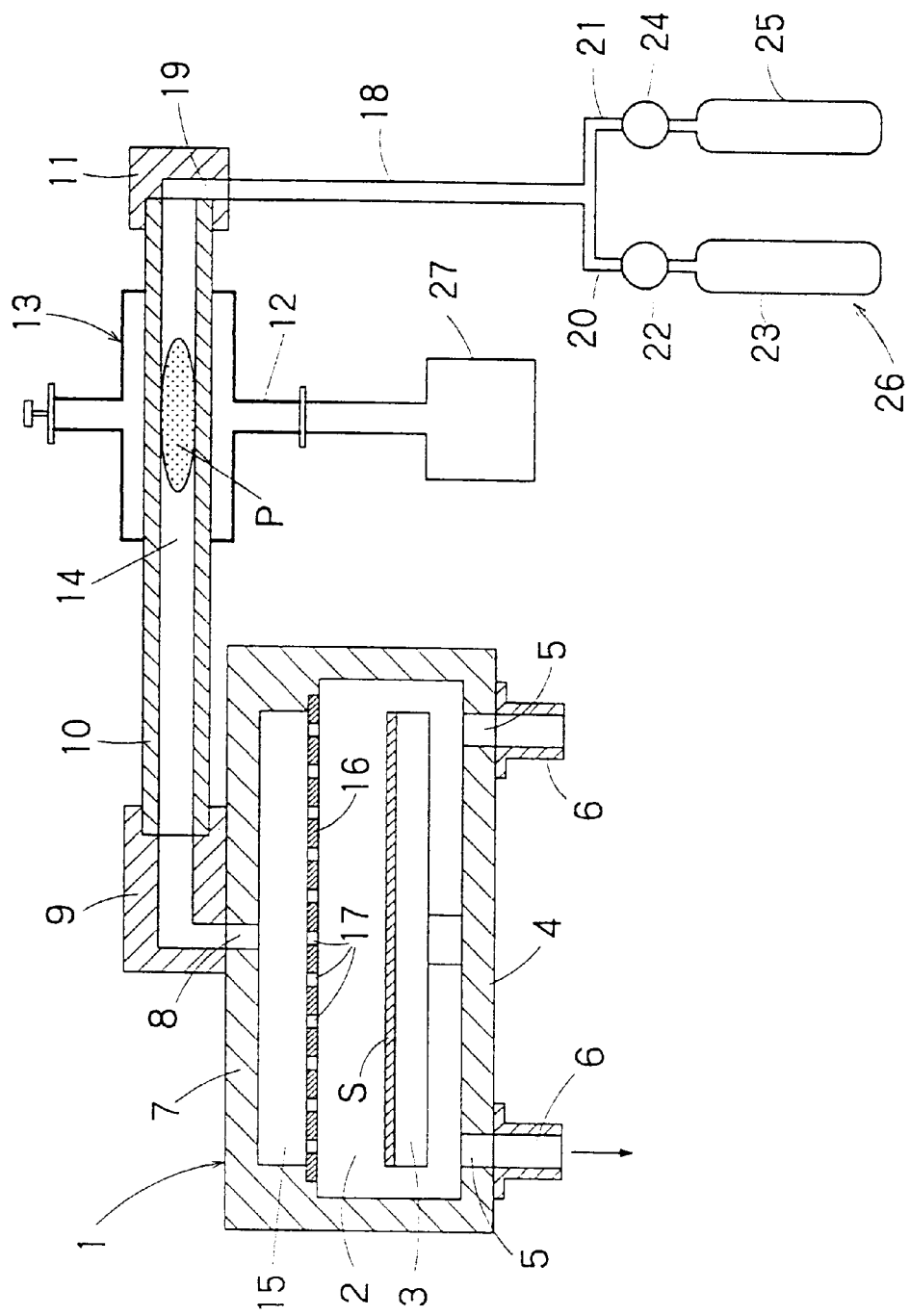
F I G. 1

| CONDITIONS FOR FLUORINATION AND ETCHING | ETCHING DEPTH |
|---|---|
| FLUORINATION : 0 min<br>ETCHING : 60 min | 3.9 μm |
| FLUORINATION : 1 min<br>ETCHING : 60 min | 0.5 μm |

VACUUM PROCESSING METHOD AND VACUUM PROCESSING APPARATUS

This application is a continuation of International PCT application No. PCT/JP98/01949 filed on Apr. 28, 1998.

BACKGROUND OF THE INVENTION

1. Field of the Invention

The present invention relates to a vacuum processing method using oxygen radicals for processing an object to be processed in a processing chamber defined by a vacuum vessel, and a vacuum processing apparatus for carrying out the same.

2. Description of the Background

Semiconductor wafers for fabricating ICs and glass substrates for liquid crystal displays, etc. (hereinafter referred to as "object to be processed" or "object") are processed by a process, such as an etching process or an ashing process, by a vacuum processing method using a vacuum processing apparatus. The vacuum processing method and the vacuum processing apparatus place an object in a processing chamber defined by a vacuum vessel and process the object in an evacuated atmosphere.

Conventional vacuum processing methods and apparatus for carrying out the same include a chemical dry etching (CDE) method and an apparatus for carrying, out the same which produce radicals in a plasma producing chamber separated from a processing chamber by activating a process gas, and introduce the radicals into the processing chamber to etch a thin film formed on a surface of the object placed in the processing chamber with the radicals.

Conventional vacuum processing methods and apparatus for carrying out the same further include a reactive ion etching (RIE) method and an apparatus for carrying out the same which produce a plasma by applying a radio-frequency voltage to a process gas supplied into a processing chamber, and etch an object placed in the processing chamber with the plasma produced in the processing chamber, and a microwave plasma etching method and an apparatus for carrying out the same which produce a plasma by exciting a process gas supplied into a processing chamber by applying a microwave to the process gas, and etch an object placed in the processing chamber with the plasma.

When an object is processed with oxygen radicals by the conventional vacuum processing method and the apparatus for carrying out the same, organic structural members and organic adhesives are etched if they are exposed to oxygen radicals in the processing chamber.

Referring to FIG. 6, an electrostatic chuck 28 for fixedly holding an object is placed on a support surface 3a of an object support table 3 place in a processing chamber. The electrostatic chuck 28 has an electrode sheet 29, and electrode covering sheets 30 sandwiching the electrode sheet 29 therebetween.

The electrode covering sheets 30 are formed of a heat-resistant polymer, i.e., an organic material, such as a polyimide. The lower electrode covering sheet 30 is bonded to the support surface 3a of the object support table 3 with an organic adhesive 32.

Since the electrode covering sheets 30 and the adhesive 32 are formed of organic materials, portions of the electrode covering sheets 30 and the adhesive 32 exposed to an atmosphere in the processing chamber are etched by oxygen radicals for processing the object.

Since the components formed of organic materials and exposed to the atmosphere in the processing chamber are etched by oxygen radicals, the components of the vacuum processing apparatus, such as the electrostatic chuck, are short-lived and are sources of particles that reduces the yield of products. Essentially, the vacuum processing apparatus using oxygen radicals must avoid using organic materials. However, the use of parts formed of organic materials in such an vacuum processing apparatus is unavoidable in the present circumstances because of requirements for machining parts or for the common use of parts.

Accordingly, it is an object of the present invention to provide a vacuum processing method and an apparatus for carrying out the same capable of preventing the etching of parts formed of organic materials and exposed to an atmosphere in a processing chamber even when an object is processed with oxygen radicals.

DISCLOSURE OF THE INVENTION

According to the present invention, a vacuum processing method of processing an object to be processed with an oxygen radical in a processing chamber defined by a vacuum vessel of a vacuum processing apparatus comprises the steps of: fluorinating a surface of a component formed of an organic material and exposed to an atmosphere in the processing chamber with a fluorine radical produced by activating a fluorinating gas containing at least a fluorine atom with the vacuum processing apparatus before carrying the object into the processing chamber; carrying the object into the processing chamber; and processing the object with the oxygen radical produced by activating a process gas containing at least an oxygen atom.

The term 'radical' as used in the description denotes a chemically highly active atom or molecule. Sometimes, radicals are referred to as 'active species'.

Preferably, the vacuum processing apparatus comprises an object support table disposed in the processing chamber to support the object thereon, and an electrostatic chuck mounted on a surface of the object support table to hold the object on the object support table, and the electrostatic chuck comprises an electrode, and an electrode covering sheet covering the electrode. The organic material is that forming the electrode covering sheet and an organic adhesive bonding the electrostatic chuck to the surface of the object support table.

Preferably, the vacuum processing apparatus comprises an object support table disposed in the processing chamber to support the object thereon, an electrostatic chuck mounted on a surface of the object support table to hold the object on the object support table, and a protective sheet of a fluororesin covering the electrostatic chuck to protect the same. The organic material includes an organic adhesive used to bond the protective sheet.

Preferably, the fluorinating gas is a mixed gas including a gas containing at least a fluorine atom and an $O_2$ gas.

Preferably, the gas containing at least a fluorine atom is one of $CF_4$, $C_2F_6$, $C_3F_8$, $NF_3$ and $SF_6$, or a mixture of some of these gases.

Preferably, a ratio of a flow rate of the $O_2$ gas to a flow rate of the fluorinating gas including the $O_2$ gas is 40% or below.

Preferably, the process gas contains at least an $O_2$ gas.

Preferably, the process gas and the fluorinating gas are activated in a plasma producing chamber separated from the processing chamber, and the fluorine radical or the oxygen radical is supplied into the processing chamber.

Preferably, the object processing step processes the plurality of objects successively, and the fluorinating step is performed after the object processing step, and the object processing step and the fluorinating step are repeated alternately.

The vacuum processing method according to the present invention fluorinates the component formed of organic material and exposed to the atmosphere in the processing chamber with the fluorine radical, and then processes the object with the oxygen radical. Fluorinated surface layer of the organic component serves as protective film to prevent the etching of the component formed of the organic material with an oxygen radical.

A vacuum processing apparatus according to the present invention comprises: a vacuum vessel defining a processing chamber to be evacuated; radical producing means for producing a fluorine radical by activating a fluorinating gas including at least a fluorine atom and for producing an oxygen radical by activating a process gas containing at least an oxygen atom; gas supply means for supplying the fluorinating gas or the process gas to the radical producing means; and an object support table disposed in the processing chamber to support an object to be processed thereon; wherein a surface of a component formed of an organic material and exposed to an atmosphere in the processing chamber is fluorinated by the fluorine radical, and then the object is mounted on the object support table and processed with the oxygen radical.

A vacuum processing apparatus according to the present invention comprises: a vacuum vessel defining a processing chamber to be evacuated; radical producing means for producing an oxygen radical by activating a process gas containing at least an oxygen atom; a gas supply means for supplying the process gas to the radical producing means; an object support table disposed in the processing chamber to support an object to be processed thereon; an electrostatic chuck mounted on a surface of the object support table to hold the object on the object support table; and a protective sheet formed of a fluororesin and covering the electrostatic chuck to protect the electrostatic chuck.

Preferably, a surface of a component formed of an organic material and exposed to an atmosphere in the processing chamber is fluorinated with a fluorine radical produced by activating a fluorinating gas containing at least a fluorine atom with the radical producing means.

Preferably, the fluorinating gas is a mixed gas including a gas containing at least a fluorine atom and an $O_2$ gas.

Preferably, the gas containing at least a fluorine atom is one of $CF_4$, $C_2F_6$, $C_3F_8$, $NF_3$ and $SF_6$, or a mixture of some of these gases.

Preferably, a ratio of a flow rate of the $O_2$ gas to a flow rate of the fluorinating gas including the $O_2$ gas is 40% or below.

Preferably, the process gas contains at least an $O_2$ gas.

Preferably, the radical producing means has a plasma producing chamber separated from the processing chamber, and the radical produced in the plasma producing chamber is supplied into the processing chamber.

Preferably, a cycle of fluorinating a component formed of an organic material and exposed to an atmosphere in the processing chamber and successively processing a plurality of objects is repeated.

The vacuum processing apparatus according to the present invention fluorinates the surface of the component formed of the organic material and exposed to the atmosphere in the processing chamber with the fluorine radical, and then processes the object with the oxygen radical. The fluorinated surface layer of the component serves as protective film to prevent the etching of the component formed of the organic material with the oxygen radical.

The vacuum processing apparatus according to the present invention is provided with the protective sheet of a fluororesin covering the electrostatic chuck. Therefore, the etching of the electrostatic chuck with the oxygen radical can be prevented by the protective sheet covering the electrostatic chuck.

BRIEF DESCRIPTION OF THE DRAWINGS

FIG. 1 is a schematic, longitudinal sectional view of chemical dry etching system (CDE system), i.e., a vacuum processing apparatus, in a preferred embodiment according to the present invention;

BEST MODE FOR CARRYING OUT THE INVENTION

Figures 2, 3:
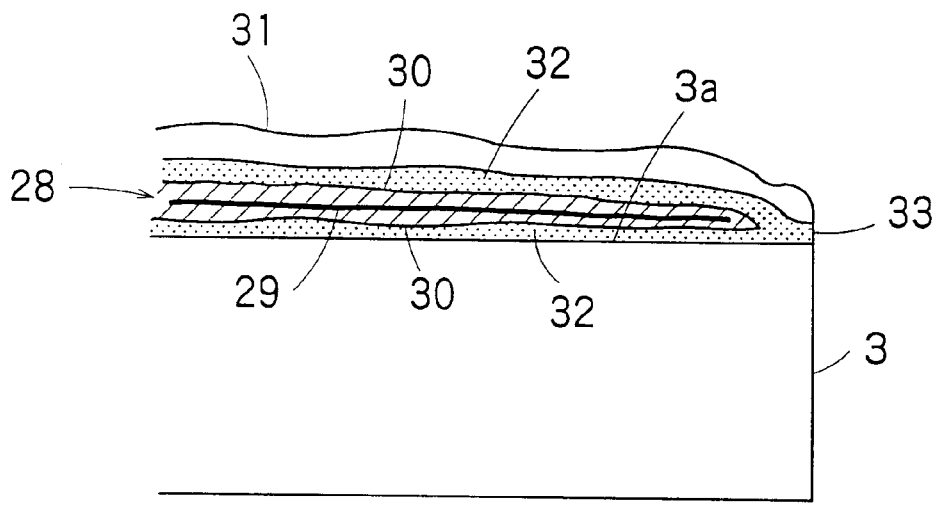
FIG. 2 is an enlarged, fragmentary, schematic longitudinal sectional view of an object support table included in the vacuum processing apparatus shown in FIG. 1.
FIG. 3 is a table showing the results of comparative experiments conducted to demonstrate the protective effect of fluorination on protecting organic components.

A vacuum processing method and an apparatus for carrying out the same embodying the present invention will be described hereinafter with reference to the accompanying drawings.

FIG. 1 shows a downflow chemical dry etching system (CDE system) as an example of a vacuum processing apparatus for carrying out a vacuum processing method embodying the present invention.

Referring to FIG. 1, the CDE system has a vacuum vessel 1 defining a processing chamber 2, and an object support table 3 disposed in the processing chamber 2. A object S is supported on the object support table 3. The object support table 3 is provided with a temperature regulator, not shown. The temperature of the object S can be regulated by the temperature regulator.

The vacuum vessel 1 has a bottom wall 4 provided with gas outlet openings 5. Each of discharge pipes 6 has one end connected to a vacuum pump, not shown, and the other end connected to the outlet opening 5. The vacuum vessel 1 has a top wall 7 provided with a gas inlet opening 8. A gas supply pipe 9 formed of a fluororesin is connected to the gas inlet opening 8. A quartz pipe 10 has one end connected to the gas supply pipe 9 and the other end sealed by a sealing member 11 internally provided with a gas passage 19. A gas supply pipe 18 has one end connected to the sealing member 11 and the other end connected to branch pipes 20 and 21.

The branch pipes 20 and 21 are connected to a first gas cylinder 23 provided with a first flow regulating valve 22 and a second gas cylinder 25 provided with a second flow regulating valve 24, respectively. The first gas cylinder 23 and the second gas cylinder 25 constitute a gas supply source (gas supply means) 26.

The first gas cylinder 23 contains a gas containing at least fluorine atoms, preferably, one of $CF_4$, $C_2F_6$, $C_3F_8$, $NF_3$ and $SF_6$, or a mixture of some of these gases. The second gas cylinder 25 contains a gas containing at least oxygen atoms, preferably, a gas containing at least $O_2$ gas.

A plasma producing device (radical producing means) 13 provided with a waveguide 12 is combined with the quartz pipe 10 so as to surround a section of the quartz pipe 10. A plasma producing chamber 14 is formed in the section of the quartz pipe 10 surrounded by the plasma producing device 13. A microwave generator 27 is connected to the waveguide 12.

A shower plate 16 provided with a plurality of gas jetting holes 17 is placed in the processing chamber 2 so as to form a gas storage chamber 15 above the processing chamber 2 to distribute radicals supplied into the processing chamber 2 uniformly over the entire surface of the object S.

FIG. 2 is an enlarged, fragmentary, schematic longitudinal sectional view of the object support table 3 of the CDE system shown in FIG. 1. As shown in FIG. 2, an electrostatic chuck 28 for fixedly holding the object S by electrostatic attraction is placed on a support surface 3a of the object support table 3. The electrostatic chuck 28 has an electrode sheet 29 of a conductive material, such as copper, and electrode covering sheets 30 sandwiching the electrode sheet 29 therebetween. The electrode covering sheets 30 are formed of a heat-resistant polymer, i.e., an organic material, such as a polyimide. The lower electrode covering sheet 30 is bonded to the support surface 3a of the object support table 3 with an organic adhesive 32.

The electrostatic chuck 28 is covered with a protective sheet 31. Preferably, the protective sheet 31 is formed of a fluororesin. Since the electrode covering sheets 30 of an organic material are covered with the protective sheet 31, the erosion of the surfaces of the electrode covering sheets 30 by the etching action of oxygen radicals which are used for etching the object S can be processed.

The protective sheet 31 is bonded to the surface of the upper electrode covering sheet 30 of the electrostatic chuck 28 and to a peripheral region of the support surface 3a of the object support table 3 with the organic adhesive 32. The peripheral surface 33 of the layer of the organic adhesive 32 is exposed to an atmosphere in the processing chamber 2 (FIG. 1). Therefore, the peripheral surface 33 of the layer of the organic adhesive 32 is subject to erosion by etching while the object S is processed with oxygen radicals unless the some measures are taken to protect the peripheral surface 33.

Some parts of components formed of organic materials are exposed, for example, on the inner surface of the vacuum vessel 1 in addition to the peripheral surface 33 of the layer of the organic adhesive 32.

The vacuum processing method and the apparatus embodying the present invention evacuates the vacuum vessel 1 to a vacuum (reduced pressure) by removing gases and vapors through the outlet openings 5 and the discharge pipes 6 by the vacuum pump before carrying the object S into the processing chamber 2.

The gas containing at least fluorine atoms is supplied from the first gas cylinder 23 through the branch pipe 20, the gas supply pipe 18 and the gas passage of the sealing member 11 into the quartz pipe 10. At the same time, the gas contained at least oxygen atoms is supplied from the second gas cylinder 25. The first flow regulating valve 22 and the second flow regulating valve 24 are adjusted so that the gas containing at least fluorine atoms and the gas containing at least oxygen atoms are supplied at flow rates and flow rate ratios suitable for fluorinating the organic components.

Microwaves generated by the microwave generator 27 are guided by the waveguide 12 of the plasma producing device 13 into the plasma producing chamber 14. Consequently, glow discharge is generated in the plasma producing chamber 14 and a plasma P is produced, whereby fluorine contained in the mixed gas for fluorination is excited and fluorine radicals are produced.

The fluorinating gas containing fluorine radicals is supplied through the quartz pipe 10, the gas supply pipe 9 and the gas inlet opening 8 into the gas storage chamber 15. Then, the fluorinating gas is jetted from the gas storage chamber 15 through the gas jetting holes 17 so as to be uniformly distributed in the processing chamber 2 by pressure difference between the gas storage chamber 15 and the processing chamber 2.

Fluorine radicals thus supplied into the processing chamber 2 fluorinate, for example, the peripheral surface 33 of the layer of the organic adhesive 32, i.e., a surface of an organic component exposed to an atmosphere in the processing chamber 2. The fluorinating gas reacted with the peripheral surface 33 of the layer of the organic adhesive 32 is discharged through the gas outlet openings 5 and the discharge pipes 6 by the vacuum pump.

Such a fluorinating process is continued for a time necessary to form a fluorinated film of a desired thickness. Then, the supply of the gases from the first gas cylinder 23 and the second gas cylinder 25 is stopped, and the object S is carried into the processing chamber 2. Subsequently, the gas containing at least oxygen atoms is supplied through the branch pipe 21, the gas supply pipe 18 and the gas passage 19 of the sealing member 11 into the quartz pipe 10. At the same time, the gas containing at least fluorine atoms is supplied from the first gas cylinder 23. The first flow regulating valve 22 and the second flow regulating valve 24 are adjusted so that the gas containing at least fluorine atoms and the gas containing at least oxygen atoms are supplied at flow rates and flow rate ratios suitable for etching the object S.

Microwaves generated by the microwave generator 27 are guided by the waveguide 12 of the plasma producing device 13 into the plasma producing chamber 14. Consequently, glow discharge is generated in the plasma producing chamber 14 and a plasma P is produced, whereby oxygen contained in the process gas, i.e., a mixed gas of the gas containing at least oxygen atoms and the gas containing at least fluorine atoms, is excited and oxygen radicals are produced.

The process gas containing oxygen radicals is supplied through the quartz pipe 10, the gas supply pipe 9 and the gas inlet opening 8 into the gas storage chamber 15. Then, the process gas is jetted from the gas storage chamber 15 through the gas jetting holes 17 so as to be uniformly distributed in the processing chamber 2 by pressure difference between the gas storage chamber 15 and the processing chamber 2. Oxygen radicals thus supplied into the processing chamber 2 reacts with a thin film formed on a surface of the object S to etch the thin film by an etching process. The process gas reacted with the thin film formed on the surface of the object S is discharged through the gas outlet openings 5 and the discharge pipes 6 by the vacuum pump.

The oxygen radicals supplied into the processing chamber 2 reach, for example, the peripheral surface 33 of the layer of the organic adhesive 32, i.e., a surface of an organic component exposed to the atmosphere of the processing chamber 2. However, the etching of the peripheral surface 33 of the layer of the organic adhesive 32 and the like by the oxygen radicals is limited to the least unavoidable extent and are etched very little because the peripheral surface 33 of the layer of the organic adhesive 32 and the like are fluorinated beforehand.

The etching process stopped after successively etching several or several tens of objects S, and the fluorinating process is performed after removing the last object S from the object support table 3 to fluorinate the surfaces of the organic components again. Then, the etching process is resumed. Thus, the fluorinating process and the etching process are repeated alternately to process several or several tens of objects S successively after fluorinating the surfaces of the organic components.

Although the embodiment has been described as applied to the etching process for etching objects, the embodiment is applicable also to an ashing process.

Preferably, the fluorinating gas is one of $CF_4$, $C_2F_6$, $C_3F_8$, $NF_3$ and $SF_6$, or a mixture of some of these gases.

Preferably, the process gas is a gas containing at least $O_2$ gas.

Although the electrostatic chuck 28 of the vacuum processing apparatus in the foregoing embodiment is covered with the protective sheet 31, the present invention may be embodied by a vacuum processing method and an apparatus provided with the electrostatic chuck 28 not covered with any sheet corresponding to the protective sheet 31.

Figure 6:
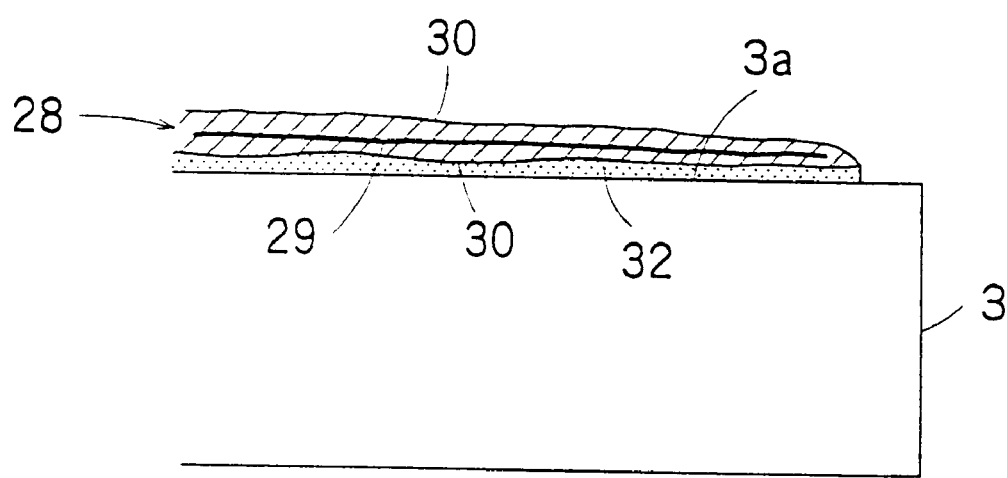
FIG. 6 is an enlarged, fragmentary, schematic longitudinal sectional view of an object support table included in a conventional vacuum processing apparatus.

When the object support table 3 as shown in FIG. 6 is employed, the surface of the electrode covering sheet 30 formed of an polyimide and the exposed surface of the layer of the organic adhesive 32 are fluorinated by a fluorinating process similar to that described above before an object S is mounted on the object support table 3.

Thus, the etching of the electrode covering sheet 30 and the surface of the layer of the organic adhesive 32 with oxygen radicals can be prevented in the etching process for etching the object S with oxygen radicals.

FIG. 3 shows the results of comparative experiments conducted by using the CDE system shown in FIG. 1 to demonstrate the protective effect of the fluorinating process on protecting organic components. Wafers provided with a carbon film, i.e., an organic film, was used as samples. Although the experiments demonstrate the effect of the fluorinating process on the organic films formed on the surfaces of the wafers, the effect holds true for the organic components of the walls of the vacuum vessel 1 and the object support table 3, such as the layer of the organic adhesive and the sheet of a polyimide.

In FIG. 3, the result of experiments in which the fluorinating process was omitted and the sample wafer was subjected to an etching process for 60 min is shown in an upper section. The etching process used an etching gas containing one part $CF_4$ gas and three parts $O_2$ gas and microwaves of 450 W in power. The processing chamber 2 was evacuated at 40 Pa and the object support table 3 was kept at 5° C. The carbon film was etched by a depth of 3.9 $\mu$m.

The result of experiments in which the sample wafer was subjected to the fluorinating process and the same etching process of the foregoing conditions is shown in a lower section in FIG. 3. The fluorinating process used a mixed gas containing three parts $CF_4$ gas and one part $O_2$ gas. The etching process used an etching gas containing one part $CF_4$ gas and three parts $O_2$ gas and microwaves of 700 W in power. The processing chamber was evacuated at 40 Pa and the object support table 3 was kept at 5° C. for the fluorinating process. After the fluorinating process, the sample wafer was subjected to the etching process.

The carbon film was etched by a depth of only 0.5 $\mu$m, which proved the great effect of fluorination on the suppression of etching of the carbon film by oxygen radicals.

Figure 4:
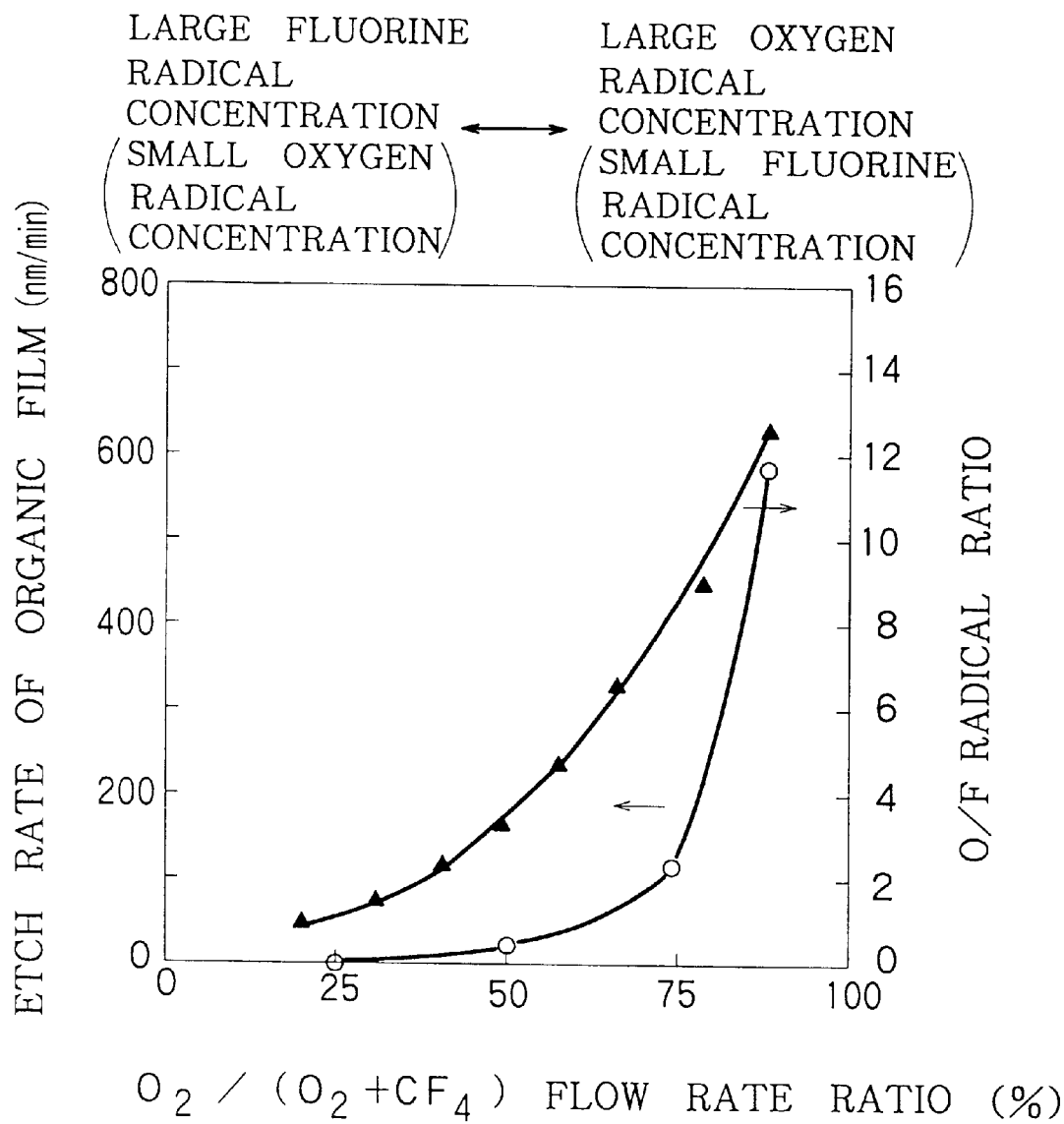
FIG. 4 is a graph showing etching rate, and O/F radical ratio determined by emission spectral analysis when a component formed of an organic material is etched with a mixed gas containing $CF_4$ and $O_2$.

FIG. 4 is a graph showing etching rate, and O/F radical ratio determined by emission spectral analysis when a film of an organic material was etched with a mixed gas containing $CF_4$ and $O_2$. In FIG. 4, $O_2/(O_2+CF_4)$ flow rate ratio, i.e., the ratio of the flow rate of $O_2$ gas to the flow rate of the mixed gas ($O_2+CF_4$), is measured on the horizontal axis.

As obvious from FIG. 4, the O/F radical ratio, i.e., the ratio of the amount of oxygen radicals to that of fluorine radicals produced, and etch rate at which the organic film is etched is increasing along with the increase of $O_2/(O_2+CF_4)$ flow rate ratio. When the $O_2/(O_2+CF_4)$ flow rate ratio is about 25% ($CF_4$ gas:$O_2$ gas=3:1), the organic film is etched at a negligibly small etch rate. Therefore, when the fluorinating process is carried out according to such conditions, etching of organic components causes problems scarcely.

Figure 5:
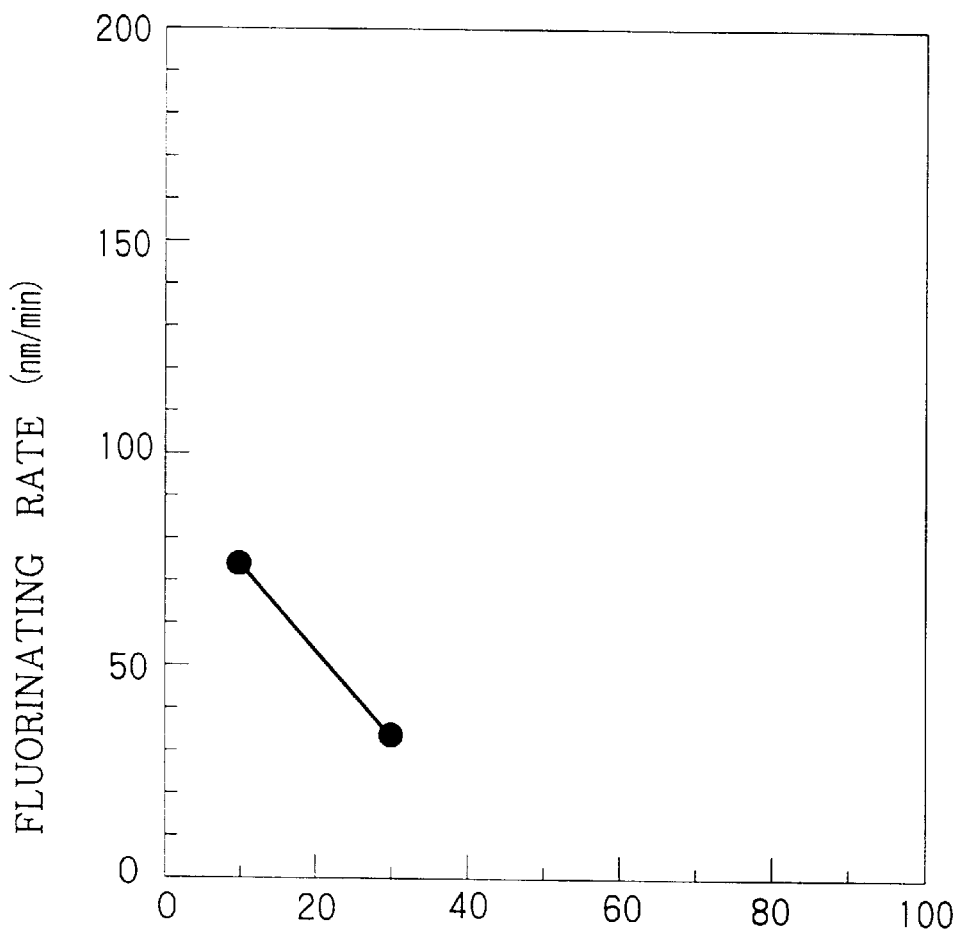
FIG. 5 is a graph showing the dependence of fluorinating rate on $O_2/(O_2+CF_4)$ flow rate ratio when an organic film is fluorinated with a mixed gas containing $CF_4$ and $O_2$ by the CDE system shown in FIG. 1.

FIG. 5 is a graph showing the dependence of fluorinating rate on $O_2/(O_2+CF_4)$ flow rate ratio, i.e., the ratio of flow rate of $O_2$ gas to that of the mixed gas containing $O_2$ gas and $CF_4$ gas, when an organic film is fluorinated with the mixed gas containing $CF_4$ and $O_2$ by the CDE system shown in FIG. 1. As obvious from FIG. 5, the organic film is scarcely fluorinated when the $O_2/(O_2+CF_4)$ flow rate ratio is greater than 40%.

When the mixed gas containing $CF_4$ and $O_2$ is used as a fluorinating gas, a preferable $O_2/(O_2+CF_4)$ flow rate ratio is not greater than 40%.

As is apparent from the foregoing description, the vacuum processing method and the apparatus for carrying the same embodying the present invention fluorinate the surfaces of the organic components exposed to the atmosphere in the processing chamber 2 with fluorine radicals in the fluorinating process, and then etches the object S with oxygen radicals in the etching process. Therefore, etching of the organic components with oxygen radicals can be prevented.

Since the electrostatic chuck 28 is covered with and protected by the protective sheet 31 of a fluororesin, etching of the electrode covering sheets 30 of the electrostatic chuck 28 with oxygen radicals can be prevented.

Since the fluorinating process for fluorinating the organic components can be achieved by the vacuum processing apparatus, any special apparatus for the fluorination of the organic components is unnecessary, and the members requiring fluorination by the fluorinating process need not be removed from the vacuum processing apparatus.

The present invention is not limited in its practical application to the foregoing CDE method and the CDE system, and is applicable to various vacuum processing methods and vacuum processing apparatus which process objects in a vacuum atmosphere. More concretely, the present invention is applicable to dry etching methods and apparatus for carrying out the same, such as reactive ion etching (RIE) methods and apparatus for carrying out the same and microwave plasma etching methods and apparatus for carrying out the same, or ashing methods and apparatus for carrying out the same.

INDUSTRIAL APPLICABILITY

The present invention can be applied to an etching/ashing process for etching/ashing semiconductor wafers for fabricating ICs and glass substrates for liquid crystal displays.

What is claimed is:

1. A vacuum processing method of processing at least one object to be processed with an oxygen radical in a processing chamber defined by a vacuum vessel of a vacuum processing apparatus, which comprises the steps of:
   a) activating a fluorinating gas containing at least a fluorine atom and a gas containing at least an oxygen atom in a plasma producing chamber separated from the processing chamber for producing a fluorine radical;
   b) supplying the fluorine radical and the oxygen radical into the processing chamber, not yet containing said at least one object to be processed;
   c) fluorinating a surface of a component of the processing apparatus, said component being formed of an organic material and exposed to an atmosphere in the processing chamber with the fluorine radical;
   d) moving the at least one object to be processed into the processing chamber after the surface of the component has been fluorinated; and
   e) processing the at least one object to be processed with an oxygen radical produced by activating a process gas in the plasma producing chamber.

2. The vacuum processing method of claim 1, wherein the vacuum processing apparatus comprises an object support table disposed in the processing chamber to support the at least one object to be processed thereon, and an electronic chuck mounted on a surface of the object support table to hold the at least one object to be processed thereon;

the electrostatic chuck comprises an electrode, and an electrode covering sheet covering the electrode; and the organic material comprises a material forming the electrode covering sheet and an organic adhesive bonding the electrostatic chuck to the surface of the object support table.

3. The vacuum processing method of claim 1, wherein the vacuum processing apparatus comprises an object support table disposed in the processing chamber to support the at least one object to be processed thereon, an electrostatic chuck mounted on a surface of the object support table to hold the object support table, and a protective sheet of a fluororesin covering the electrostatic chuck to protect the electrostatic chuck; and the organic material comprises an organic adhesive to bond the protective sheet.

4. The vacuum processing method of claim 1, wherein the gas containing at least one fluorine atom comprises $CF_4$, $C_2F_6$, $C_3F_8$, $NF_3$ or $SF_6$, or a mixture thereof.

5. The vacuum processing method of claim 1, wherein a ratio of a flow rate of the $O_2$ gas to a flow rate of the fluorinating gas and the $O_2$ gas is 40% or below.

6. The vacuum processing method of claim 1, wherein the process gas contains at least $O_2$ gas.

7. The vacuum processing method of claim 1, wherein a cycle of fluorinating the surface of the component and processing a plurality of objects is repeated.

8. The vacuum processing method of claim 4, wherein said gas containing at least one fluorine atom is $CF_4$.

9. The vacuum processing method of claim 5, wherein the fluorinating gas is $CF_4$, and the ratio of flow rates ($O_2/(O_2+CF_4)$) is about 25 to 40%.

10. The vacuum processing method of claim 9, wherein the ratio of flow rates is about 25%.

11. The vacuum processing method of claim 1, wherein said at least one object to be processed is a semiconductor wafer.

12. The vacuum processing method of claim 1, wherein said at least one object to be processed is a glass substrate for a liquid crystal display.

* * * * *